(12) United States Patent
Ross et al.

(10) Patent No.: US 7,872,487 B2
(45) Date of Patent: Jan. 18, 2011

(54) SEMICONDUCTOR WAFER HAVING A MULTITUDE OF SENSOR ELEMENTS AND METHOD FOR MEASURING SENSOR ELEMENTS ON A SEMICONDUCTOR WAFER

(75) Inventors: Holger Ross, Paderborn (DE); Hubert Benzel, Pliezhausen (DE); Roland Guenschel, Reutlingen (DE); Harald Guenschel, Gerach (DE)

(73) Assignee: Robert Bosch GmbH, Stuttgart (DE)

( * ) Notice: Subject to any disclaimer, the term of this patent is extended or adjusted under 35 U.S.C. 154(b) by 32 days.

(21) Appl. No.: 12/276,572

(22) Filed: Nov. 24, 2008

(65) Prior Publication Data

US 2009/0189629 A1    Jul. 30, 2009

(30) Foreign Application Priority Data

Dec. 27, 2007   (DE)   ................. 10 2007 062 711

(51) Int. Cl.
*G01R 31/02* (2006.01)
*G01R 31/26* (2006.01)

(52) U.S. Cl. .............. 324/763; 324/765; 324/158.1; 73/723

(58) Field of Classification Search ......... 324/754–765, 324/158.1

See application file for complete search history.

(56) References Cited

U.S. PATENT DOCUMENTS

| 4,140,965 | A | * | 2/1979 | Neal | 324/551 |
| 6,142,021 | A | * | 11/2000 | Ross et al. | 73/727 |
| 6,771,089 | B1 | * | 8/2004 | Wilcox | 324/765 |
| 6,930,499 | B2 | * | 8/2005 | Van Arendonk et al. | 324/763 |
| 2003/0043015 | A1 | * | 3/2003 | Gershfeld | 340/2.28 |

FOREIGN PATENT DOCUMENTS

DE    696 33 713    2/2002
EP    0 786 667    7/1997

* cited by examiner

*Primary Examiner*—Ha Tran T Nguyen
*Assistant Examiner*—Emily Y Chan
(74) *Attorney, Agent, or Firm*—Kenyon & Kenyon LLP

(57) ABSTRACT

In the measurement of sensor elements in a wafer composite, whereby non-electric stimuli are to be applied to the sensor elements, a semiconductor wafer having a multitude of sensor elements, each sensor element having a voltage supply connection, a grounded connection, and at least one sensor signal output, is configured such that a bus system is integrated in the semiconductor wafer, to which bus system at least the grounded connections of the sensor elements are connected and via which a supply voltage may be applied to the sensor elements, and that each sensor element is equipped with at least one controllable switching element for selecting the sensor element, so that only a selected sensor element supplies a sensor signal to a diagnosis device.

9 Claims, 3 Drawing Sheets

SEMICONDUCTOR WAFER HAVING A MULTITUDE OF SENSOR ELEMENTS AND METHOD FOR MEASURING SENSOR ELEMENTS ON A SEMICONDUCTOR WAFER

CROSS-REFERENCE TO RELATED APPLICATIONS

The present application claims priority to Application No. 10 2007 062 711.6, filed in the Federal Republic of Germany on Dec. 27, 2007, which is expressly incorporated herein in its entirety by reference thereto.

FIELD OF THE INVENTION

The present invention relates to a semiconductor wafer having a multitude of sensor elements, each sensor element having a supply voltage connection, a grounded connection, and at least one sensor signal output.

Furthermore, the present invention relates to a method for measuring such sensor elements in the wafer composite.

BACKGROUND INFORMATION

At present, silicon sensors on the wafer level are tested purely electrically. In practice, to do this, test and handling systems that generate electric stimuli by placing needles at specific contact points of the sensor elements are used to detect voltages and currents at different temperatures and thus to evaluate the electric function parameters of the individual sensor elements. The moving and fine positioning of the needles at the contact points must be performed separately for each sensor element on the wafer. The more sensor elements disposed on the wafer, the more time accordingly required for the mechanical positioning of the contact needles. Furthermore, this positioning is becoming ever more critical since the sensor elements are becoming smaller and smaller.

The individual sensor elements are measured and adjusted during the application of non-electric stimuli such as pressure, acceleration, rate of rotation, etc., only after separation and packaging or installation.

DE 696 33 713 T2 describes measures for electronically selecting and electronically testing chips that are not separated on a wafer. Thus, bad chips are to be identified and eliminated even before the separation in order to continue the manufacturing process using only the chips that are good at the time of testing and in this manner to achieve a highest possible yield of functional components. To this end, all chips that are implemented on a wafer are connected to a bus system having a bus line for wafer supply voltage and a bus line for wafer grounding. Electric energy is supplied to the chips via this bus system. Defects, in particular short-circuited chips, are able to be identified and, where necessary, separated from the bus system. Furthermore, DE 696 33 713 T2 suggests that the integrated circuits of the individual chips be designed such that they may be optionally operated actively or in a bypass mode as part of the test carried out in the wafer composite. If a chip is actively connected, electric test signals are applied to its contact points via the bus system and via the neighboring chips existing in the bypass mode in order to check the functionality of the selected chip.

SUMMARY

Example embodiments of the present invention provide measures for measuring sensor elements in the wafer composite, whereby non-electric, that is, mechanical and/or chemical, stimuli such as pressure, acceleration, rate of rotation, etc., are applied to the sensor elements.

To this end, a bus system is to be integrated on a semiconductor wafer of the type mentioned at the outset, to which bus system at least the grounded connections of the sensor elements are connected and via which a supply voltage may be applied to the sensor elements. Additionally, each sensor element is to be equipped with at least one controllable switching element for selecting the sensor element, so that only a selected sensor element supplies sensor signals to a diagnosis device.

As part of the method described herein for measuring sensor elements on such a semiconductor wafer, non-electric stimuli are applied to the entire wafer including all sensor elements. At least one sensor element is selected by controlling the corresponding switching element, so that in each instance the sensor signal from the at least one selected sensor element that is reacting to stimuli is detected by a diagnosis device.

The measures described herein allow not only for the identification and elimination of bad, faulty sensor elements, but rather also for the calculation of individual adjustment parameters for each individual sensor element on a semiconductor wafer.

Example embodiments of the present invention may be used both on sensor elements that supply electric sensor signals and on sensor elements that transmit optic sensor signals. The diagnosis device must be configured according to the type of sensor element.

The functioning method of the switching element for selecting a sensor element may also be a function of its type. Thus, it is advisable to couple optical receiver elements to a switching element via which the voltage supply connection is connected to the bus system. In this variant, only selected sensor elements are provided with voltage.

In the case of electric sensor elements, the sensor signal output is also advantageously routed to the bus system to which the diagnosis device is then connected. In this case, there is the possibility of connecting the switching element upstream of the sensor signal output, or between sensor signal output and bus system, so that only the sensor signal of a selected sensor element is applied to the bus system.

The selection of individual sensor elements is meaningful only if the individual sensor elements are also able to be identified. For example, the position of the sensor element on the semiconductor wafer may be used as an identifying feature. However, this information is lost when the sensor elements are separated. Each sensor element may be equipped with a switching element that may be digitally coded and into which an individual address may be programmed. With the aid of this address it is possible to uniquely identify each sensor element even after the separation.

In that there are different options for the functional disposing of switching elements, the switching elements may also be based on different functional principles. If the switching elements of the individual sensor elements are provided with a digital address code, they may simply be controlled electrically by a select connection of the respective sensor element. In this context, it may be provided that this select connection is also connected to the bus system.

However, the switching elements may also be controllable through optical excitation. In this case, the individual sensor elements may simply be selected with the aid of their position on the wafer. A sensor ID or address is not necessary. An integrated phototransistor that may be controlled using a laser is particularly well suited to be used as an optically controllable switching element that is connected in series to the digital sensor signal output of a sensor element. For analog sensor signals, a combination that includes an integrated phototransistor able to be controlled using a laser, and an analog switch having a high resistance in the non-switched state may be provided. The sensor to be adjusted is selected through the positioning of the laser scanner in conjunction with a digital image/pattern recognition.

The diagnosis device may be used not only to measure the individual sensor elements, but also to calculate individual adjustment parameters for each individual selected sensor element. If the sensor elements may also be uniquely identified after the separation as well, the actual adjustment may also take place after the installation of the sensor elements. Under specific circumstances an adjustment may also be performed in the wafer composite. In this case, an adjustment circuit is integrated on each sensor element. The prerequisite for this is that after the separation and during the subsequent packaging the sensor properties change only minimally or at least are predictable so that correction values may be held in reserve.

According to example embodiments of the present invention, a semiconductor wafer includes: a plurality of sensor elements, each sensor element having a voltage supply connection, a grounded connection, and at least one sensor signal output. A bus system is integrated into the semiconductor wafer, to which bus system at least the grounded connections of the sensor elements are connected, and via which a supply voltage is appliable to the sensor elements, and each sensor element includes at least one controllable switching element adapted to select the sensor element, so that only a selected sensor element provides a sensor signal to a diagnosis device.

The voltage supply connection of the sensor elements may be connected to the bus system via the switching element, so that only a selected sensor element is supplied with voltage.

The sensor signal output of the sensor elements may be connected to the bus system via the switching element, so that only the sensor signal of a selected sensor element is applied to the bus system.

The switching element may be digitally codable.

The switching element may be controllable via a select connection of the sensor element, and the select connection may be connected to the bus system.

The switching element may be controllable via optical excitation.

An integrated phototransistor controllable using a laser may act as a switching element for digital sensor signals.

A combination that includes an integrated phototransistor controllable using a laser, and a high-resistance analog switch may act as a switching element for analog sensor signals.

An adjustment circuit may be integrated on each sensor element.

According to example embodiments of the present invention, a method for measuring sensor elements on a semiconductor wafer including a plurality of sensor elements, each sensor element having a voltage supply connection, a grounded connection, and at least one sensor signal output, a bus system integrated into the semiconductor wafer, to which bus system at least the grounded connections of the sensor elements are connected, and via which a supply voltage is appliable to the sensor elements, and each sensor element includes at least one controllable switching element adapted to select the sensor element, so that only a selected sensor element provides a sensor signal to a diagnosis device, includes: applying stimuli to an entire wafer including all sensor elements; selecting at least one sensor element by controlling a corresponding switching element; and detecting the sensor signal of the at least one selected sensor element by a diagnosis device.

The switching element of the at least one sensor element may be provided with a digital address code, and the sensor element may be selected in accordance with the address code.

The switching element of the at least one sensor element may be controllable via optical excitation and the sensor element is selected in accordance with a position on the wafer.

The sensor signals may include electric signals, and in each instance only the sensor signal of the at least one selected sensor element may be applied to the bus system of the semiconductor wafer, to which bus system the diagnosis device may also be connected.

The sensor signals may include optical signals, and the diagnosis device may detect optically the sensor signal of the at least one selected sensor element.

The diagnosis device may calculate individual adjustment parameters for the selected sensor element in accordance with the detected sensor signals.

Further features and aspects of example embodiments of the present invention are described in more detail below with reference to the appended Figures.

DETAILED DESCRIPTION

Figure 1:
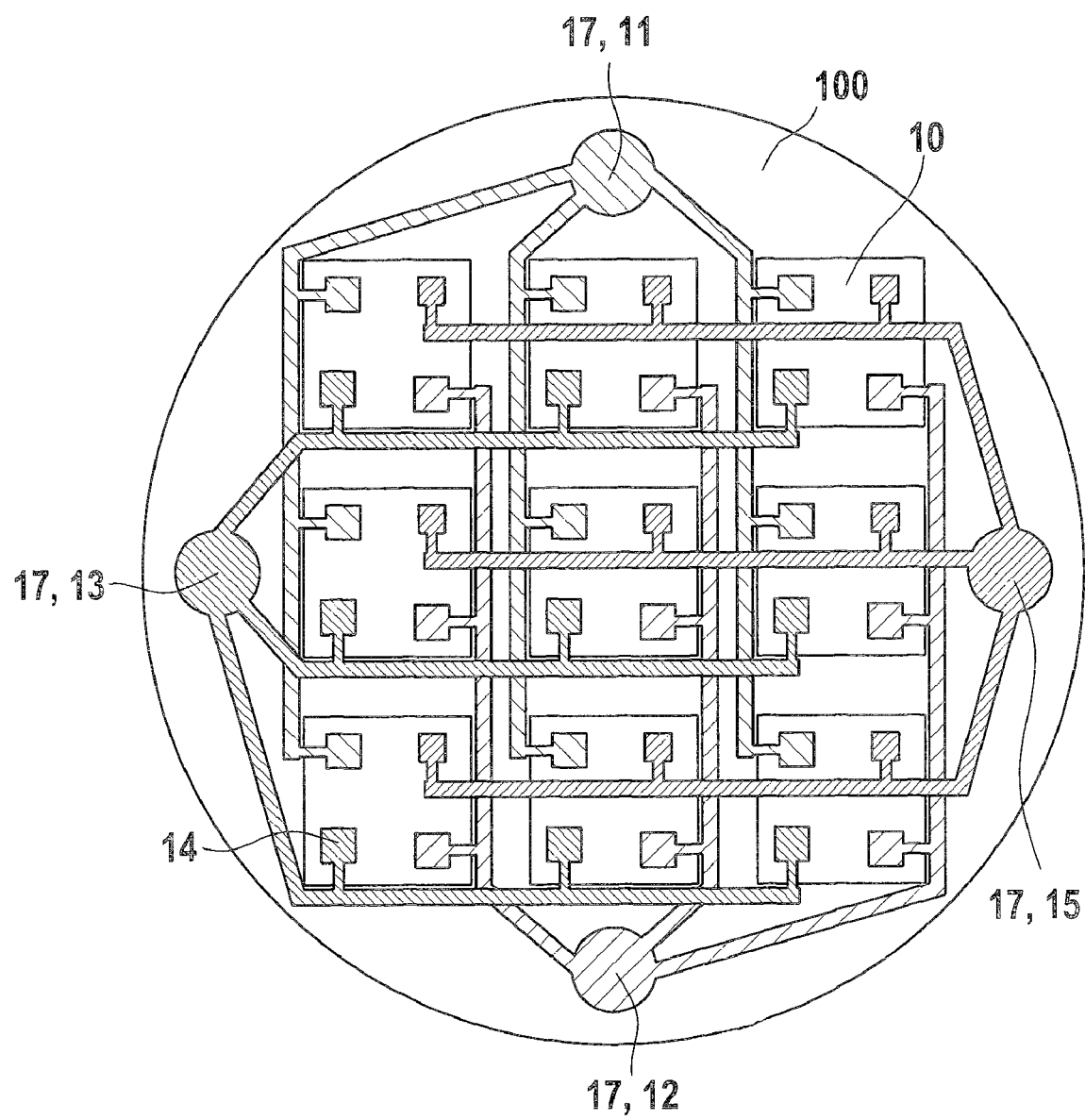
FIG. 1 is a schematic top view of a semiconductor wafer having sensor elements according to an example embodiment of the present invention.

FIG. 1 illustrates a semiconductor wafer 100 having nine sensor elements 10, which stand for a multitude of sensor elements, in the manner that they are normally disposed on a semiconductor wafer during production. Sensor elements 10 may be micromechanical pressure sensors, for example. Each of these sensor elements 10 is equipped with a voltage supply connection 11, a grounded connection 12, and a sensor signal output 13.

Apart from sensor elements 10, a bus system 17 is integrated on semiconductor wafer 100, to which both voltage supply connections 11 and grounded connections 12 of sensor elements 10 are connected. The arrangement of bus system 17 and of sensor elements 10 should guarantee that defective sensor elements may be recognized and removed. For example, sensor elements that short circuit a bus line are labeled defective. If the connection of the individual sensor elements to the voltage supply takes place via severable arc gaps, defective sensor elements may simply be removed in a pre-measuring step. Another option is to integrate an overcurrent detector on each sensor element, which independently interrupts the voltage supply in the event of a short circuit.

According to example embodiments of the present invention, each sensor element 10 is equipped with a controllable switching element 14 for selecting sensor element 10, so that only a selected sensor element 10 supplies a sensor signal to a diagnosis device. The diagnosis device is not illustrated.

In the exemplary embodiment described, sensor elements 10 supply electric sensor signals. In this context, they may be either analog or digital output signals. Switching elements 14 ensure that in each instance only the sensor signal of a selected sensor element 10 is applied to bus system 17, to which the diagnosis device is also connected.

Switching elements 14 may be coded digitally and are provided with an address code via which each sensor element 10 is able to be uniquely identified and also accordingly selected. The address codes are programmed into the individual sensor elements or the switching elements of the individual sensor elements in a pre-measuring step, for example. Using switching elements 14 programmed in this manner, an entire network of sensor elements 10 is able to be monitored using only one or two I/O pins. Fourteen address bits suffice to control up to $2^{14}$ (16,384) sensor elements, which is more than sufficient for a wafer.

Switching elements 14 are respectively connected to a select connection 15 of sensor element 10, which is connected to bus system 17. A unidirectional single-wire bus system is suitable for controlling sensor elements having analog output voltages. To be able to select sensor elements having an analog output signal, a combination of a chip-selecting address decoder and an analog switch as switching element 14 is necessary, whereby the analog switch should be connected to the output line such that it has sufficiently high resistance in the non-switched state. Both the address decoder and the analog switch must be integrated on the sensor element. A bidirectional $I^2C$-2-wire interface, which is also used for the A/D converters of digital sensors, is suitable for sensor elements having a digital output signal.

To measure sensor elements, non-electric stimuli, i.e., in the case of pressure sensors, pressure, are applied to the entire wafer including all sensor elements. Then the diagnosis device selects one sensor element 10 respectively with the aid of its address code and controls switching element 14 of this sensor element 10 via select connection 15 and bus system 17. Since only the sensor signal of selected sensor element 10 is ever applied to bus system 17 and transmitted to the diagnosis device, in this instance it is a multiplex function. Through this serial control, the diagnosis device is able to assign the respectively detected sensor signals to the individual sensor elements and to store this assignment. Based on the results of the sequential measurement of the individual sensor elements on the wafer, individual adjustment parameters may be calculated for each individual sensor element, such as, for example, offset, temperature coefficient (TC) offset, sensitivity and TC sensitivity, or also non-linear parameters.

An important prerequisite for the adjustment on the chip level in the wafer composite is that after the separation and during the subsequent packaging the sensor properties change only minimally or at least are predictable so that a correction value may be held in reserve. This may be implemented through a suitable packaging, for example, a mounting in the housing with soft adhesives.

The adjustment itself may simply take place digitally, via parameter bits graded in a binary manner. A suitable chip electronics causes the adjustment, e.g., the writing of an EPROM sequence or the switching of parameter bits graded in a binary manner by alloying Zener diodes. Other PROM storage principles are also possible. Alternatively, parameter bits may be electronically programmed after measurement has been carried out in the wafer composite on a classic wafer prober. In the event that an address has been programmed in, it is even possible to program the sensor chip after the separation and packaging. The latter would also allow for a readjustment of the offset influenced by the packaging.

The adjustment method described above may be used to adjust any sensors, such as piezoresistive or capacitive pressure sensors—even for higher pressure ranges—mass flow sensors, acceleration sensors, rotation sensors, or even chemical sensors, etc.

Figure 2:
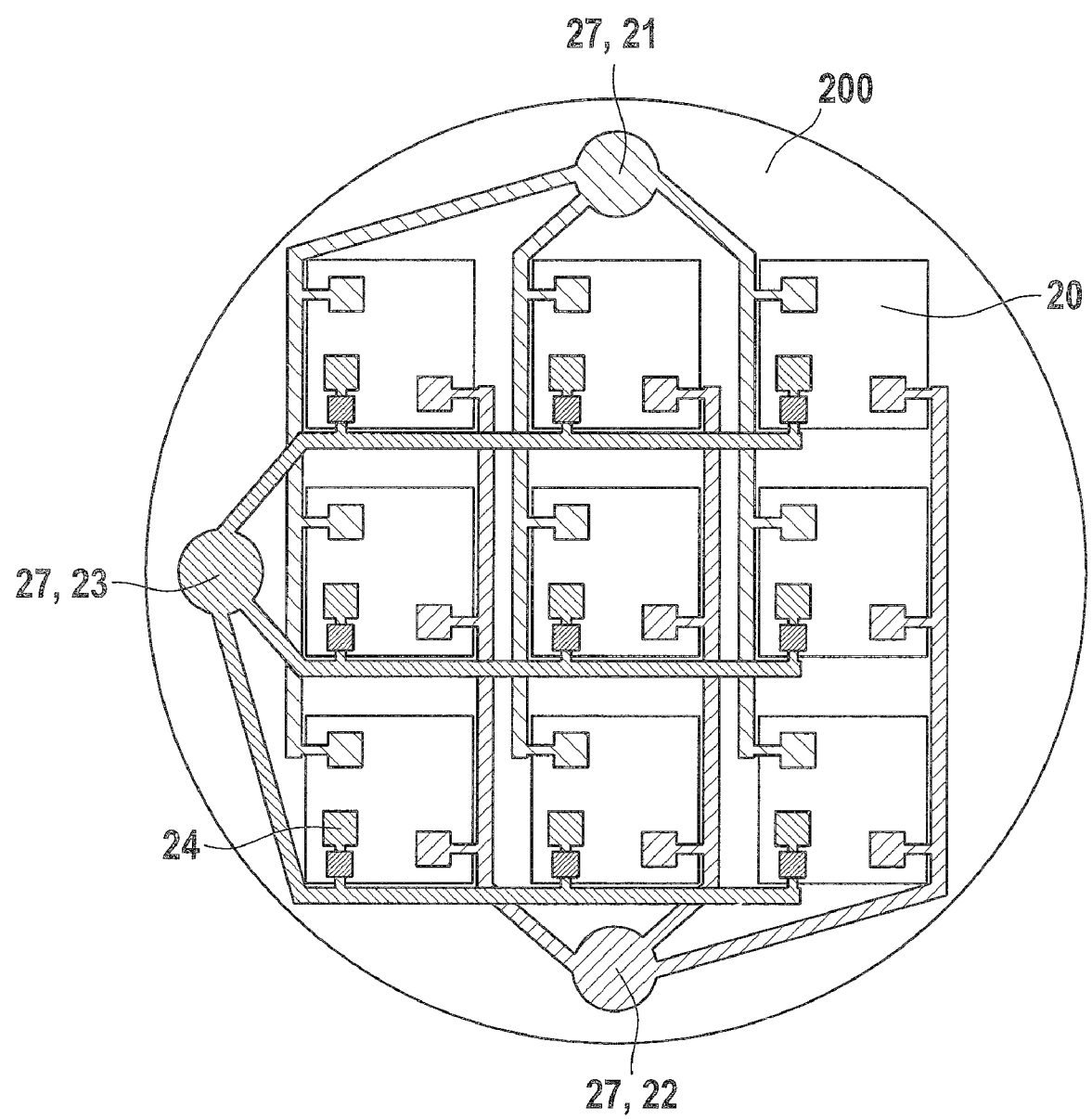
FIG. 2 is a schematic top view of a semiconductor wafer having sensor elements according to an example embodiment of the present invention.

Similar to FIG. 1, FIG. 2 shows a semiconductor wafer 200 having nine sensor elements 20 that stand for a multitude of sensor elements. Each of these sensor elements 20 is equipped with a voltage supply connection 21, a grounded connection 22, and a sensor signal output 23 for electric sensor signals.

Apart from sensor elements 20, a bus system 27 is also integrated on semiconductor wafer 200, to which both voltage supply connections 21 and grounded connections 22 and the sensor signal outputs 23 of the sensor elements 10 are connected.

According to example embodiments of the present invention, each sensor element 20 is also equipped with a controllable switching element 24 for selecting sensor element 20. Switching element 24 is connected upstream of sensor signal output 23, so that only the sensor signal of a selected sensor element 20 is applied to bus system 27. In this manner, the sensor signal may be detected by a diagnosis, which is connected to bus system 27.

Switching elements 24 are switches that may be excited optically. In this case, switching elements 24 are controlled or activated by laser. In sensor elements having digital output signals, an integrated phototransistor may simply be used as optically excitable switching element 24. For sensor elements having analog output signals, the use of an integrated photo transistor in combination with an analog switch that should have sufficiently high resistance in the non-switched state is advisable.

The selection of individual sensor elements 20 takes place with the aid of their position on wafer 200. In this instance too, individual adjustment parameters may be calculated for each sensor element after the sequential measuring of individual sensor elements 20.

The adjustment itself takes place preferably at the wafer level and may take place simply digitally via parameter bits graded in a binary manner. The transmission of information of the respective adjustment bit sequence to the sensor element may be carried out using light pulses to photosensitive components, such as phototransistors. A suitable chip electronics causes the adjustment, e.g., an alloying of a Zener-diode triggered by light pulses or the writing of an EPROM sequence.

Alternatively, it is also possible to carry out an electronic adjustment on a classic wafer prober or using a wafer position ID after the separation and packaging. In this case, the offset influenced by the packaging may be readjusted, for example.

Figure 3:
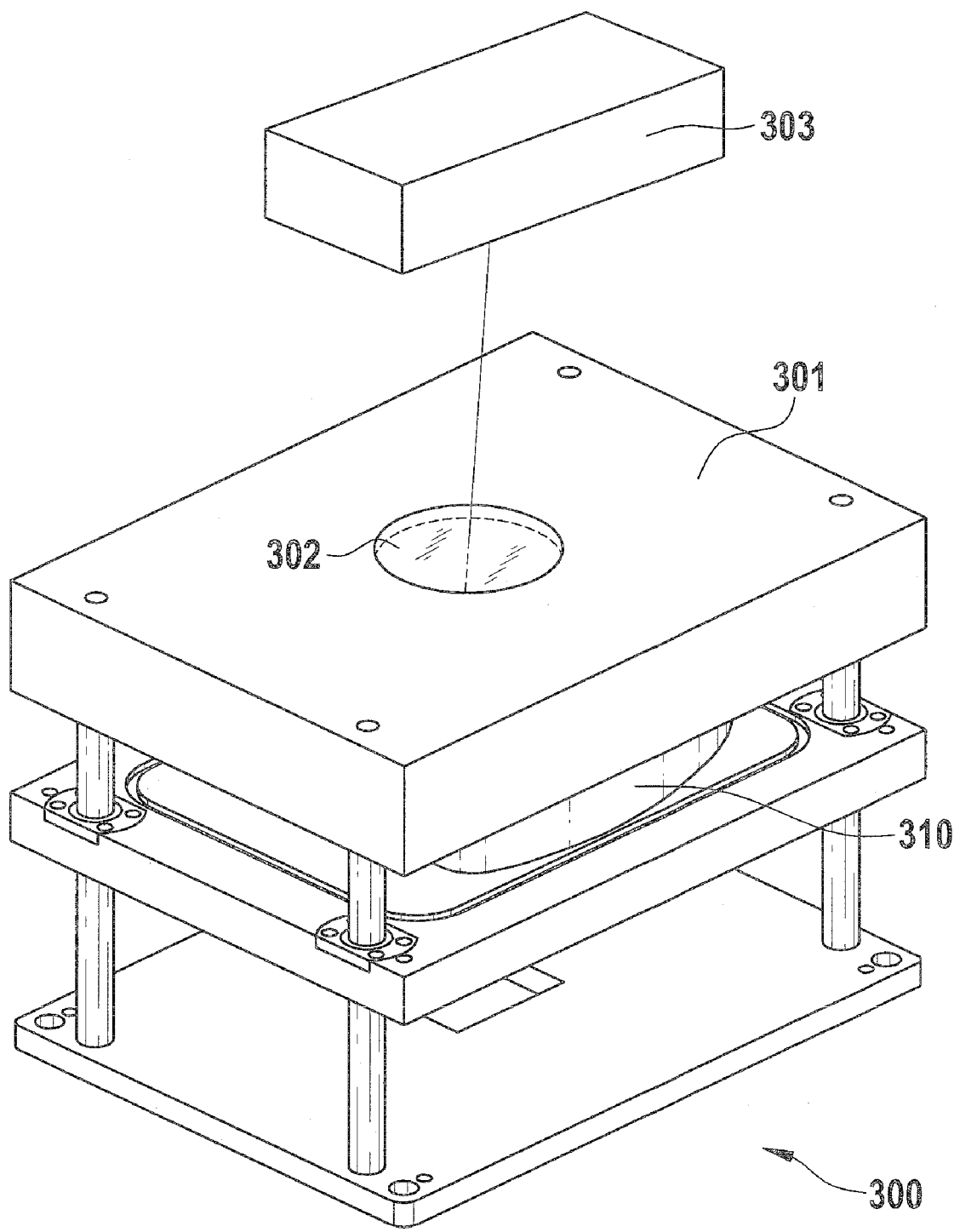
FIG. 3 illustrates a device for measuring sensor elements on a semiconductor wafer.

FIG. 3 shows a device 300 with which pressure sensor elements in the wafer composite are able to be measured. For that purpose, device 300 includes a pressure chamber 301 in which a wafer 310 having the sensor elements to be measured is disposed. In the pressure chamber, in addition to a holding device for wafer 310, contacts for the bus system integrated on wafer 310 are provided as well, in particular connections for voltage supply, ground, and the sensor signal output. Device 300 is arranged for the measurement of sensor elements on a semiconductor wafer, as described above in connection with FIG. 2. The individual sensor elements are identified with the aid of their position on wafer 310 and selected with the aid of optically controllable switching elements. For this purpose, pressure chamber 301 is equipped with a pressure-resistant quartz glass window 302, above which a laser system 303 having an integrated image processing and beam deflection is disposed.

What is claimed is:

1. A semiconductor wafer, having sensor elements to be measured, said semiconductor wafer comprising:

a plurality of sensor elements, each sensor element having a voltage supply connection, a grounded connection, and at least one sensor signal output;

wherein a bus system is integrated into the semiconductor wafer, to which bus system at least the grounded connections of the sensor elements are connected, and via which a supply voltage is appliable to the sensor elements, and each sensor element includes at least one controllable switching element adapted to select the sensor element, so that only a selected sensor element provides a sensor signal to a diagnosis device through the at least one sensor signal output.

2. The semiconductor wafer according to claim 1, wherein the voltage supply connection of the sensor elements is connected to the bus system via the switching element, so that only a selected sensor element is supplied with voltage.

3. The semiconductor wafer according to claim 1, wherein the sensor signal output of the sensor elements is connected to the bus system via the switching element, so that only the sensor signal of a selected sensor element is applied to the bus system.

4. The semiconductor wafer according to claim 1, wherein the switching element digitally codable.

5. The semiconductor wafer according to claim 1, wherein the switching element is controllable via a select connection of the sensor element, and the select connection is connected to the bus system.

6. The semiconductor wafer according to claim 1, wherein the switching element controllable via optical excitation.

7. The semiconductor wafer according to claim 6, wherein an integrated phototransistor controllable using a laser acts as a switching element for digital sensor signals.

8. The semiconductor wafer according to claim 6, wherein a combination that includes an integrated phototransistor controllable using a laser, and a high-resistance analog switch acts as a switching element for analog sensor signals.

9. The semiconductor wafer according to claim 1, wherein an adjustment circuit is integrated on each sensor element.

* * * * *